United States Patent [19]
Mizuno

[11] Patent Number: 6,018,189
[45] Date of Patent: Jan. 25, 2000

[54] LEAD FRAME FOR FACE-DOWN BONDING

[75] Inventor: Hideki Mizuno, Tokyo, Japan

[73] Assignee: NEC Corporation, Tokyo, Japan

[21] Appl. No.: 09/052,156

[22] Filed: Mar. 31, 1998

[30] Foreign Application Priority Data

Mar. 31, 1997 [JP] Japan .................................. 9-079387

[51] Int. Cl.$^7$ ................................................ H01L 23/495
[52] U.S. Cl. .......................... 257/668; 257/670; 257/675; 257/666; 257/676
[58] Field of Search ..................................... 257/666, 673, 257/670, 672, 676, 784, 668; 438/FOR 340, FOR 369, FOR 377, FOR 380; 361/723, 772, 813

[56] References Cited

FOREIGN PATENT DOCUMENTS

| 55-74148 | 6/1980 | Japan . |
| 1-244630 | 9/1989 | Japan . |
| 2-178937 | 7/1990 | Japan . |
| 2-276259 | 11/1990 | Japan . |
| 4-109640 | 4/1992 | Japan . |

*Primary Examiner*—Minh Loan Tran
*Assistant Examiner*—Luan Thai
*Attorney, Agent, or Firm*—Young & Thompson

[57] ABSTRACT

In a lead frame for face-down bonding, plural leads (3) are bonded to bumps (2) formed on electrodes of a semiconductor chip (1) by face-down bonding based on ultrasonic wave, and grooves (4) having V-shaped cross section are formed on the leads (3) at tip positions at which the leads (3) are bonded to the bumps (2). The leads comprise a first lead extending in a first direction and a second lead extending in a second direction which is different from the first direction, and all the grooves (4) extend in the same direction irrespective of the direction of the lead (3). Ultrasonic wave bonding is performed in the direction of the V-shaped groove (4) to move the bump (2) in the direction of the V-shaped groove (4) and weld the bump (2) and the lead (3) at the contact surface with the V-shaped groove (4), so that the bonding strength of the bump (2) and the lead (3) can be made uniform.

19 Claims, 8 Drawing Sheets

ULTRASONIC WAVE APPLYING DIRECTION

ULTRASONIC WAVE APPLYING DIRECTION

ULTRASONIC WAVE APPLYING DIRECTION

LEAD FRAME FOR FACE-DOWN BONDING

BACKGROUND OF THE INVENTION

1. Field of the Invention

The present invention relates to a lead frame, and particularly to a lead frame for face-down bonding which is applied to bond a semiconductor chip having bumps to leads by ultrasonic wave with the semiconductor chip placed face down.

2. Description of the Related Art

A TAB (Tape Automated Bonding) technique has been hitherto known as a method of connecting bumps formed on electrodes of a semiconductor chip to leads.

FIG. 1 is a plan view showing an integrated circuit device which is connected to inner leads by using the TAB technique (Japanese Patent Application Laid-open No. Hei-4-109640).

As shown in FIG. 1, plural bumps 12 are formed at an electrode portion on the upper surface of a semiconductor chip 11. A tape carrier 15 comprises an insulating film with a device hole 16 having a larger size than the semiconductor chip 11, and plural TAB leads 13 which are provided so as to extend from the surface of the insulating film into the device hole. The semiconductor chip 11 is disposed at the center of the device hole 16, and each bump 12 which is provided at each electrode of the semiconductor chip 11 is individually bonded to the tip of each lead 13.

As shown in FIGS. 2A and 2B, a recess portion 14 is formed at the tip of each lead 13. The two side surfaces of the recess portion 14 positioned at both ends in the width direction of the lead 13 are slanted, and the bump 12 and the lead 13 are bonded to each other so that the slanted surfaces of the recess portion 14 are brought into contact with two confronting edge portions of the bump 12. As not shown, in the above conventional technique, the bonding of the lead 13 and the bump 12 has been performed by pressing down a heated bonding tool from the upper side of the lead 13 to heat the contact portion between the lead 13 and the bump 12.

A bonding technique based on ultrasonic bonding as shown in FIG. 3 has been known as another conventional technique (Japanese Patent Application Laid-open No. Hei-1-244630). According to this technique, a semiconductor chip 23 having bumps 24 is held by a collet 25 with the semiconductor chip 23 placed face down, the bumps 24 are brought into contact with the surface of a conductive pattern 22 on an insulating substrate 21 and then ultrasonic wave is applied to the collet 25 to bond the bumps 24 to the conductive pattern 23.

This ultrasonic bonding method has an advantage that it is unnecessary to set the press force and the degree of heat to large values and thus the damage to be imposed on the semiconductor chip is relatively small.

It has been a recent tendency in the mobile communication market that portable information equipment is designed in a small and light structure, and this tendency has increasingly required that a semiconductor device or semiconductor chip serving as a part of the portable information equipment is designed to be small in area and height when it is packaged. Accordingly, in order to reduce the outer dimension of the semiconductor device, a technique to which the TAB technique or the face-down bonding technique based on ultrasonic wave is applied have been required.

However, the conventional techniques as described above have the following problems.

A first problem resides in that when the semiconductor device is bonded to the lead of the conventional lead frame used in the TAB technique by the ultrasonic bonding, the bonding strength of the leads extending in the perpendicular direction to the application direction of ultrasonic wave is weaker than the bonding strength of the leads extending in the direction parallel to the application direction of ultrasonic wave.

The reason is as follows. As shown in FIGS. 4A and 4B, each lead 13 extending in the direction perpendicular to the ultrasonic wave application direction has two slant surfaces at both ends in the width direction of the lead, and these slant surfaces disturb the motion of the bump 12 due to the ultrasonic wave to make it hard to weld the contact surface of the bump with the lead. Further, the portions of the bump which are brought into contact with the two slant surfaces of the lead are repeatedly separated from and pressed to the slant surfaces of the lead in accordance with the application of the ultrasonic wave, resulting in unstableness of the bonding between the bump and the lead.

Further, a second problem resides in that there occurs dispersion in positioning between the bump and the lead extending in the direction perpendicular to the ultrasonic wave applying direction.

The reason is as follows. When the bump is moved at the tip of the lead in the lateral direction of the lead, that is, in the ultrasonic wave applying direction, the bump abuts the two slant surfaces of the lead in the lead width direction, and thus the tip of the lead is also swung in the width direction thereof.

Accordingly, in the case of the bonding of the bump and the lead by ultrasonic wave, the direction of the ultrasonic wave must be taken into consideration every lead to apply the ultrasonic wave in the direction of the lead, resulting in lower productivity.

SUMMARY OF THE INVENTION

An object of the present invention is to provide a lead frame for face-down bonding which can enhance reliability of the semiconductor device by making uniform the bonding strength and the bonding position of the lead and bump, and can realize collective bonding of plural bumps of a semiconductor chip to leads.

In order to attain the above object, there is provided a lead frame for face-down bonding, comprising:

plural leads which are bonded to bumps formed on electrodes of a semiconductor chip by face-down bonding based on ultrasonic wave; and grooves formed on the leads at positions at which the leads are bonded to the bumps, wherein the leads comprise a first lead extending in a first direction and a second lead extending in a second direction which is different from the first direction, and all the grooves extend in the same direction.

It is preferable that each groove has a V-shaped cross section.

In one aspect of the present invention, the direction of the grooves is the first direction.

In one aspect of the present invention, the first direction is a width direction of the lead frame, the second direction is a length direction of the lead frame, and the direction of the grooves is the first direction or the second direction.

In one aspect of the present invention, the direction of the grooves is coincident with an ultrasonic wave applying direction on the face-down bonding.

In one aspect of the present invention, the leads are subjected to metal plating at least at a groove portion thereof.

There is also provided a lead frame for face-down bonding, comprising:

plural leads which are bonded to bumps formed on electrodes of a semiconductor chip by face-down bonding based on ultrasonic wave; and grooves having V-shaped cross section formed on the leads at positions at which the leads are bonded to the bumps.

The bumps which are formed at the corresponding positions on the surface of the semiconductor chip are engagedly inserted into the V-shaped grooves at the tips of the leads. By applying ultrasonic wave to the semiconductor chip in the extending direction of the V-shaped grooves, each bump is moved while being brought into contact with the slant surfaces of the corresponding V-shaped groove, and the bump and the lead are bonded to each other at the interface of the contact surfaces thereof. Accordingly, the bonding strength and the bonding position of the leads and the bumps can be made uniform and therefore, reliability of the semiconductor device manufactured by using the lead frame can be enhanced, and collective bonding of plural bumps of a semiconductor chip to leads can be easily realized.

DETAILED DESCRIPTION OF THE PREFERRED EMBODIMENT

A preferred embodiment according to the present invention will be described with reference to the accompanying drawings.

Figure 5:
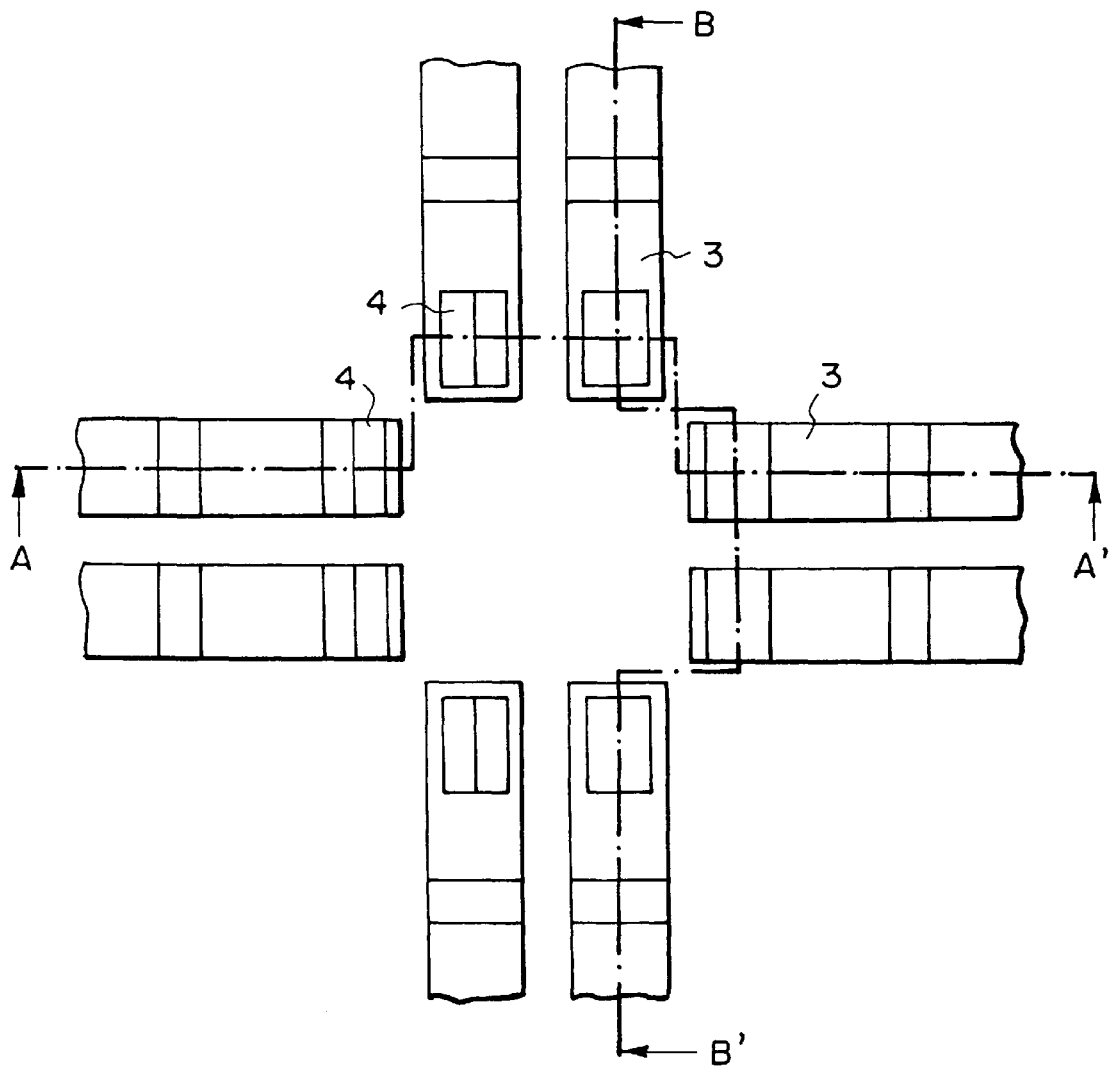
FIG. 5 is a plan view showing a lead frame for face-down bonding according to an embodiment of the present invention.
Figure 6A:
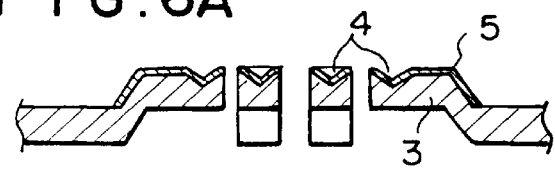
FIGS. 6A and 6B are cross-sectional views showing grooves which are provided in the face-down bonding lead frame according to the embodiment of the present invention.
Figure 6B:
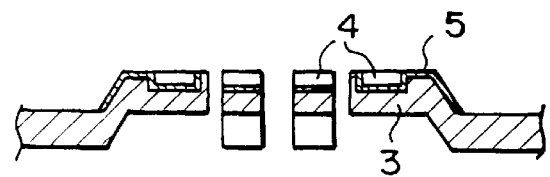

In FIGS. 5, 6A and 6B, the face-down bonding lead frame according to this embodiment is characterized in that a V-shaped groove 4 which extends in one direction is formed at the tip of each lead 3 of the lead frame. Further, a metal film 5 is plated at a thickness of 3 to 8 microns on the surface of the tips of the leads 3 together with the grooves 4.

Each V-shaped groove 4 is formed in the following manner.

As shown in FIG. 6A which is a cross section taken along line A-A' of FIG. 5, the groove 4 has V-shape irrespective of the direction of the lead 3 on which the groove 4 is formed. As shown in FIG. 6B which is a cross section taken along line B-B' of FIG. 5, the groove 4 has a linear shape irrespective of the direction of the lead 3 on which the groove 4 is formed. That is, although there are the leads extending in a first direction along line B-B' and the leads extending in a second direction along line A-A' which is perpendicular to the first direction, all the grooves 4 extend in the same direction, i.e. the first direction along line B-B'. Therefore, there are two types of the leads 3. The lead of a first type has the groove 4 extending in the direction of the lead, and the lead of a second type has the groove 4 extending in the direction perpendicular to the lead direction.

Figure 7:
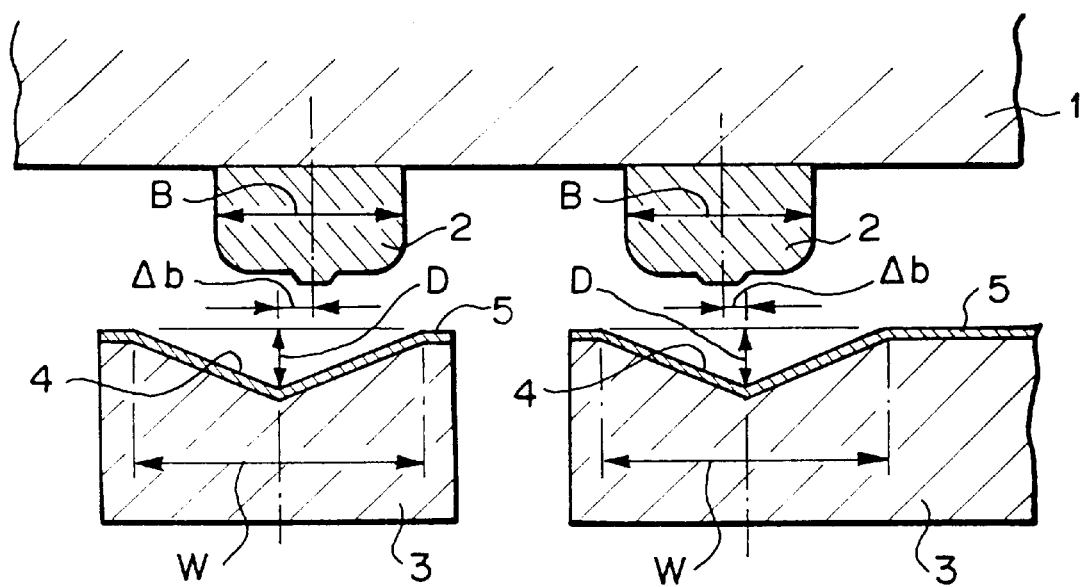
FIG. 7 is a cross-sectional view showing the dimensional relationship between a lead and a bump in the embodiment of the present invention.

Referring to FIG. 7, the width W of the V-shaped groove 4 according to this embodiment is set to about 120 to 200 microns which is equal to the sum of the diameter B (about 70 to 100 microns) of the bump 2 formed on the semiconductor chip 1 and a positional dispersion Δb of the bump 2, and the depth D of the groove 4 is set to 15 to 30 microns in consideration of the height (35 to 45 microns) of the bump 2.

Next, the method of manufacturing the face-down bonding lead frame according to the embodiment of the present invention will be described with reference to FIGS. 8A to 8D. The manufacturing method shown in FIGS. 8A to 8D is on the assumption of the manufacturing based on a press die. In FIGS. 8A, 8B, 8C and 8D, the left-side diagram of each figure is a diagram viewed from the upper side (plan view), and the right-side diagram is a diagram (cross-sectional view) obtained by sectioning the left-side diagram in a direction along lines A-A', B-B', C-C' and D-D', respectively.

Figure 8A:
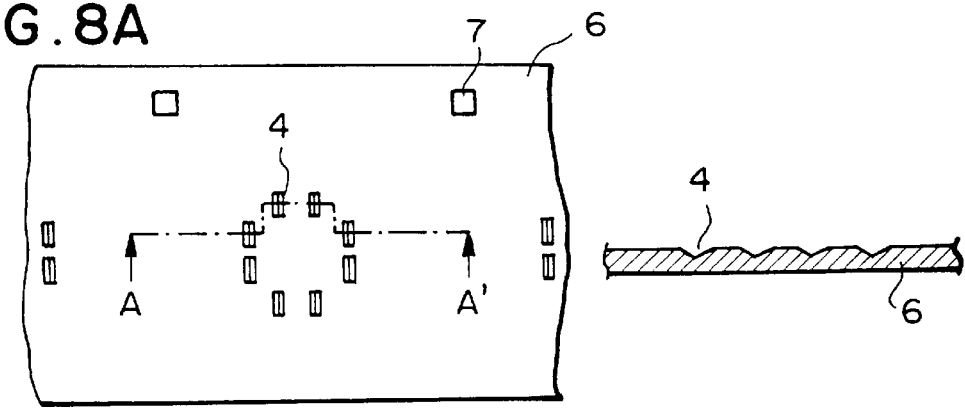
FIGS. 8A to 8D are diagrams showing a method of manufacturing the face-down bonding lead frame of the embodiment in the order of steps.

First, as shown in FIG. 8A, positioning feed holes 7 are formed in the base material of the lead frame 6, and V-shaped grooves 4 are formed at the respective position on which the tip of each lead is to be formed so as to extend in one direction. In the case of FIG. 8A, an ultrasonic wave applying direction in an ultrasonic bonding process is set to the width direction of the lead frame 6, and all the V-shaped grooves 4 extend in the width direction of the lead frame 6.

Figure 8B:
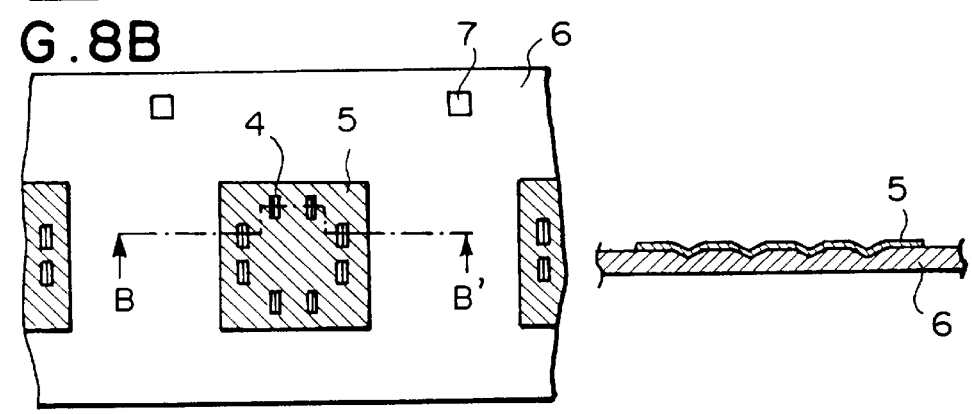
Figure 8C:
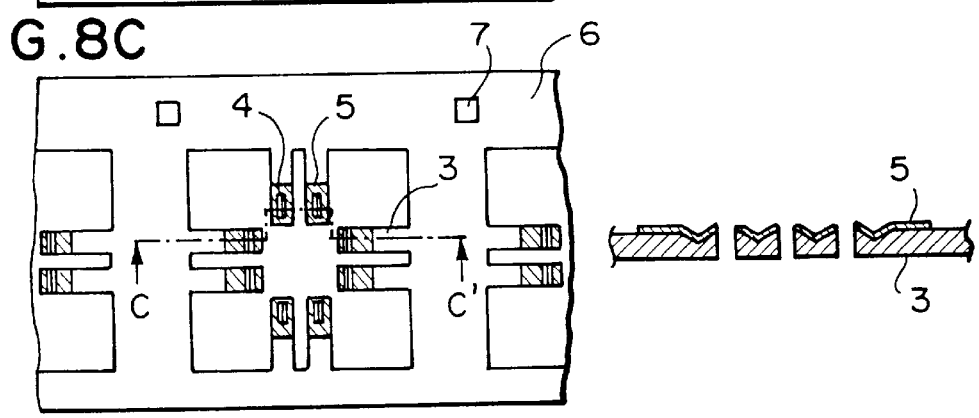
Figure 8D:
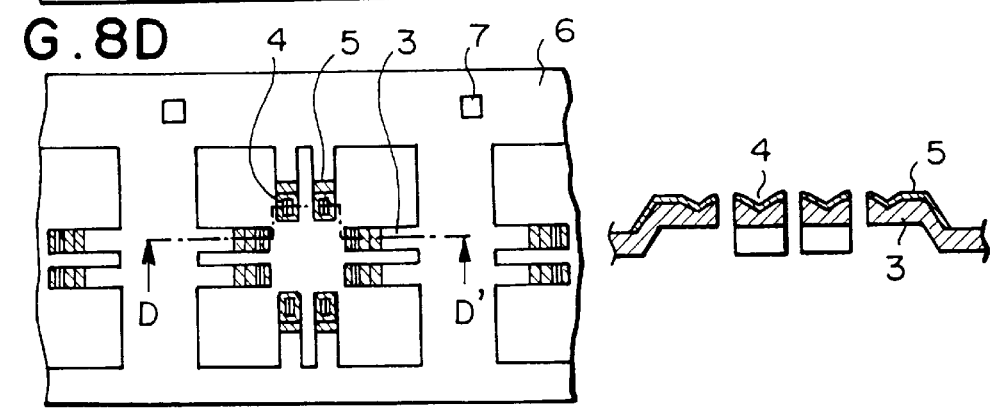

Subsequently, metal is plated in the area of the V-shaped groove 4 to form a metal film 5 as shown in FIG. 8B, and then the leads 3 are formed as shown in FIG. 8C. In this case, then the portion of the tips of the leads 3 is shaped in the dimple form as shown in FIG. 8D. In this process, the portion of the tips of the leads 3 may be shaped in another form in accordance with the packaging mode of a semiconductor device, or the dimple forming process may be omitted.

Figure 9:
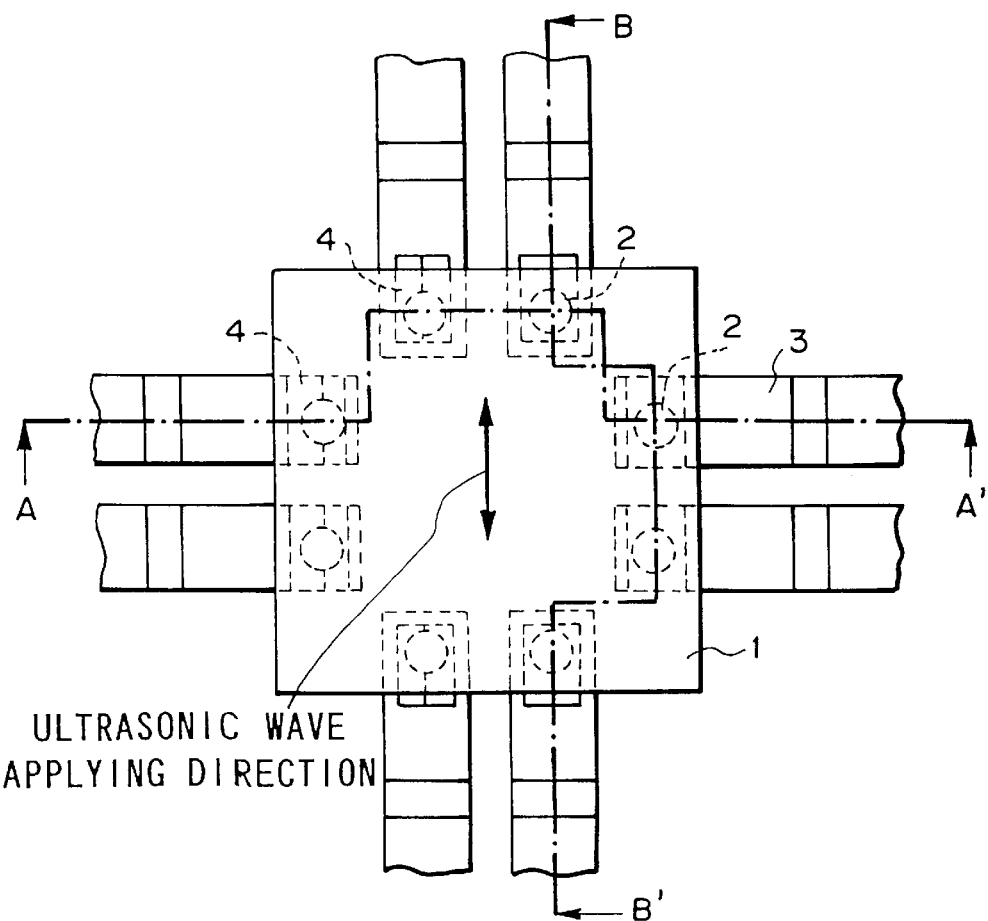
FIG. 9 is a diagram showing an ultrasonic wave face-down bonding which is performed by using the lead frame according to the embodiment of the present invention.
Figure 10A:
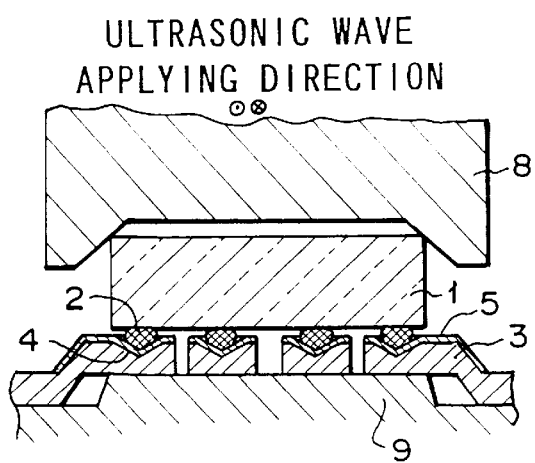
FIGS. 10A to 10B are cross-sectional views showing the ultrasonic wave face-down bonding which is performed by using the lead frame of the embodiment according to the present invention.
Figure 10B:
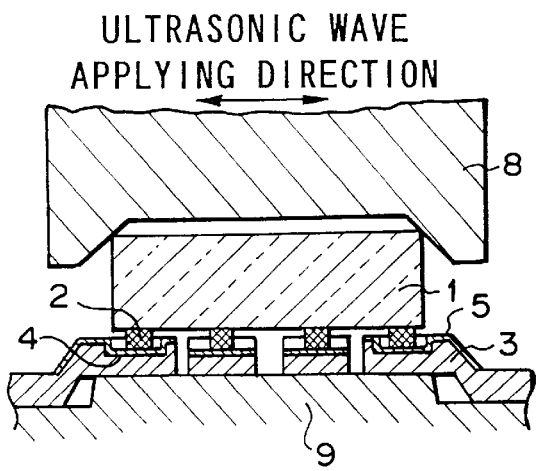

Next, the embodiment of the present invention will be further described with reference to the accompanying drawings. FIGS. 9, 10A and 10B are diagrams showing the ultrasonic wave face-down bonding using the lead frame according to the present invention. The V-shaped groove 4 of 160 microns in width and 25 microns in depth is provided at the tip of each lead 3 of the 0.1 mm-thickness lead frame of Cu. Ag (metal film 5) is plated in the tip area of each lead 3 of the lead frame to have a film thickness of 5 microns. A ball bump 2 of Au is formed in a dimension of 40 microns in height and 100 microns in diameter on an electrode on the surface of the semiconductor chip 1 by using Au wire, and the semiconductor chip 1 is positioned by a collet 8 with the semiconductor chip 1 placed face down so that the bump 2 is engagedly inserted into the V-shaped groove 4.

As shown in FIGS. 10A and 10B, the ultrasonic wave is applied to the collet 8 in the direction along which the groove 4 formed at the tip of the lead 3 extends.

A bonding stage 9 supports the lower surface of the lead 3, and the temperature thereof is increased to about 350° C. by a heater (not shown) to heat the lead 3.

Next, the bonding between the bump and the lead in this embodiment of the present invention will be described with reference to FIGS. 11A and 11B.

Figure 11A:
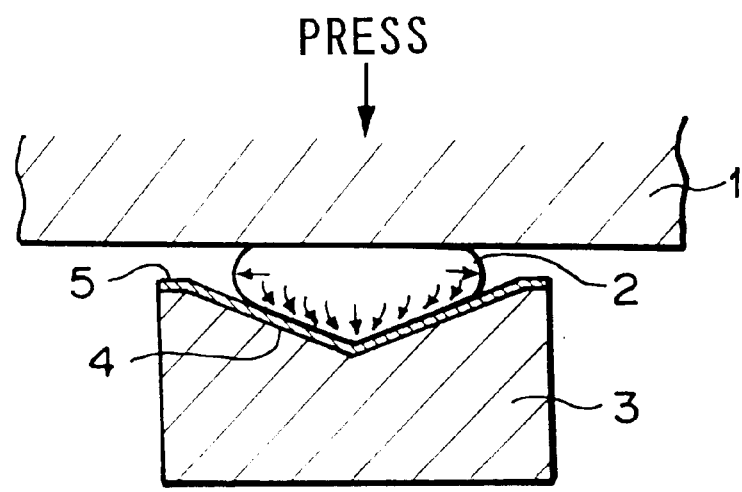
FIG. 11A is a cross-sectional view showing a bonding process between the lead and the bump in the embodiment of the present invention.
Figure 11B:
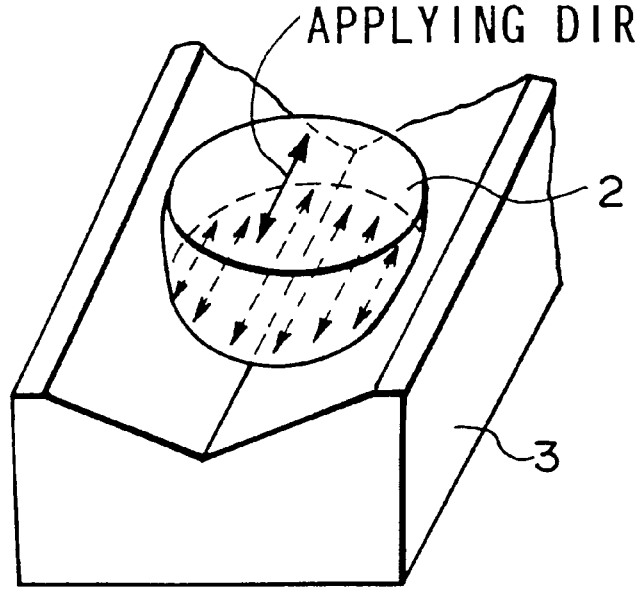
FIG. 11B is a perspective view of FIG. 11A.

As shown in FIGS. 11A and 11B, the bump 2 of the semiconductor chip 1 is brought into contact with the V-shaped groove 4. Thereafter, under the press force of the collet, the ultrasonic wave is applied to the semiconductor chip 1 in the extending direction of the V-shaped groove 4. The bump 2 is deformed as if it flows toward the center portion along the slant surfaces at both sides of the V-shaped groove 4, and bonded to the lead at the contact surface with the V-shaped groove 4.

The bump 2 of this embodiment are engagedly inserted into the V-shaped grooves 4 at the tips of the leads 3. By applying ultrasonic wave to the semiconductor chip 1 in the extending direction of the V-shaped grooves 4, each bump is moved while brought into contact with the slant surfaces of the corresponding V-shaped groove 4, and the bump and the lead are bonded to each other at the interface of the contact surfaces thereof. Accordingly, the bonding strength and the bonding position of the leads and the bumps can be made uniform.

Figure 1:
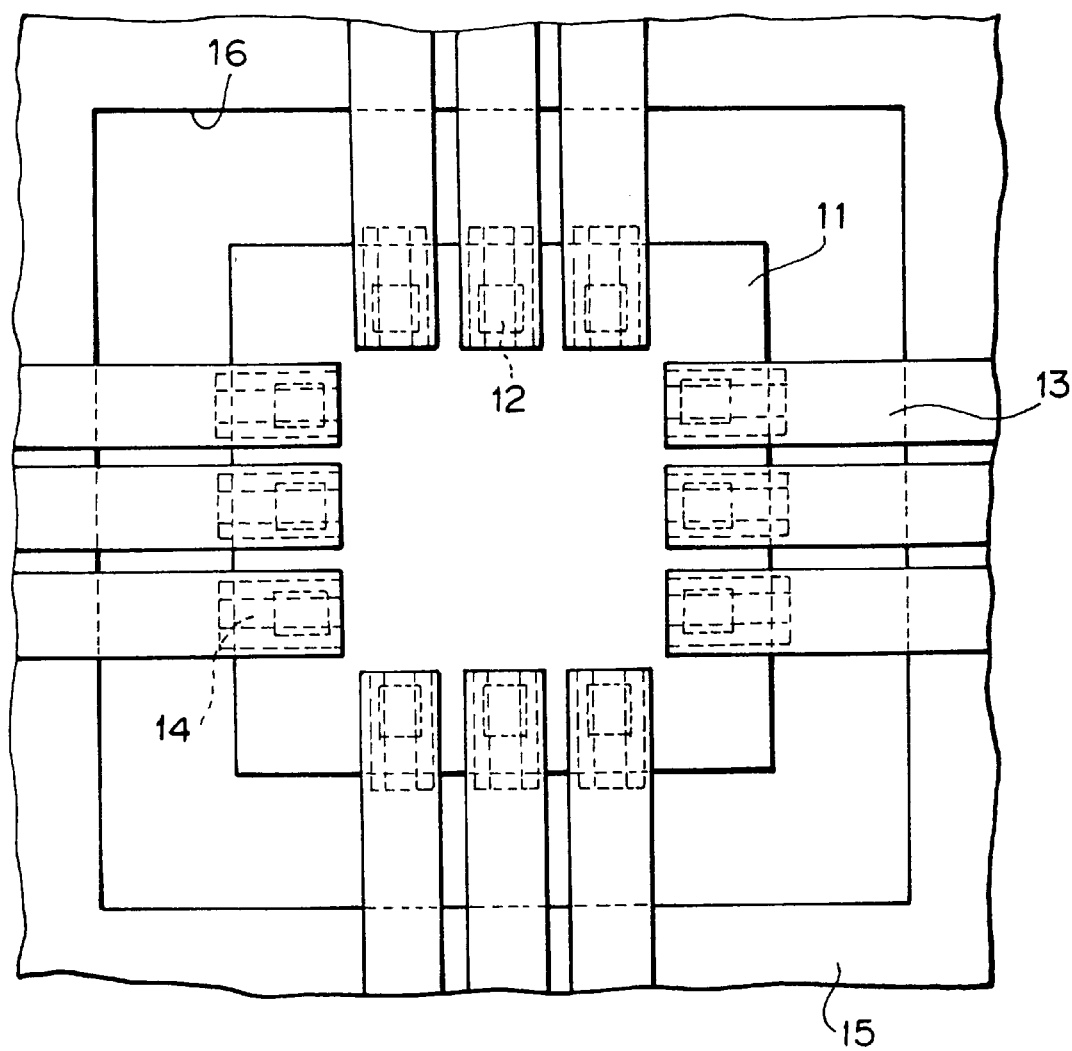
FIG. 1 is a plan view showing leads which are used for the TAB technique in the prior art.
Figure 2A:
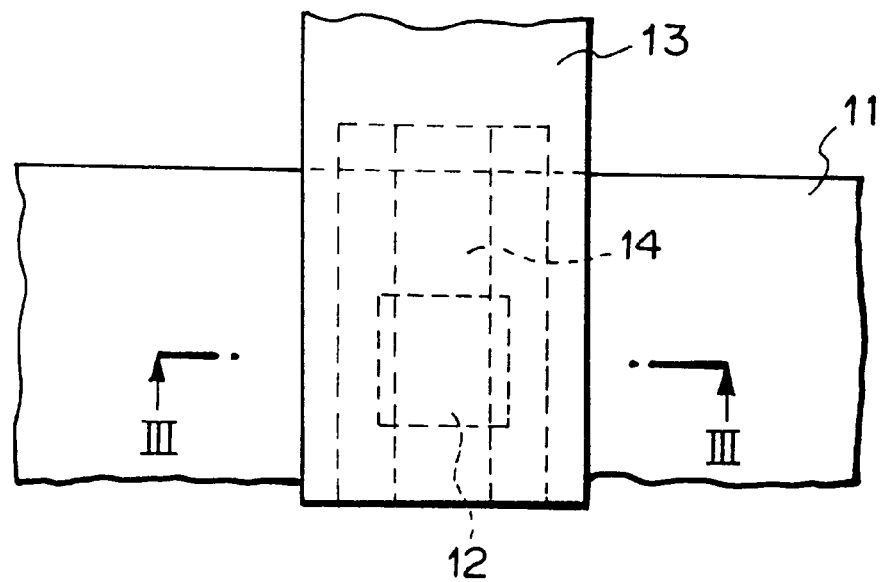
FIG. 2A is a plan view showing a bonding state between the lead and the bump in the prior art.
Figure 2B:
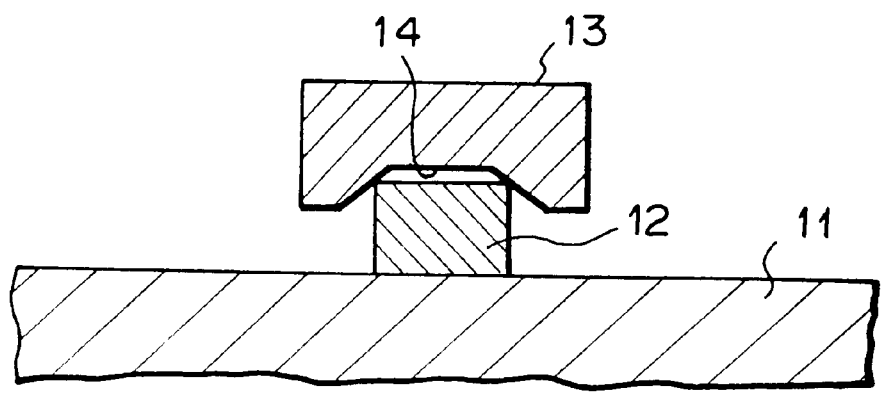
FIG. 2B is a cross-sectional view of FIG. 2A taken along line III—III.
Figure 3:
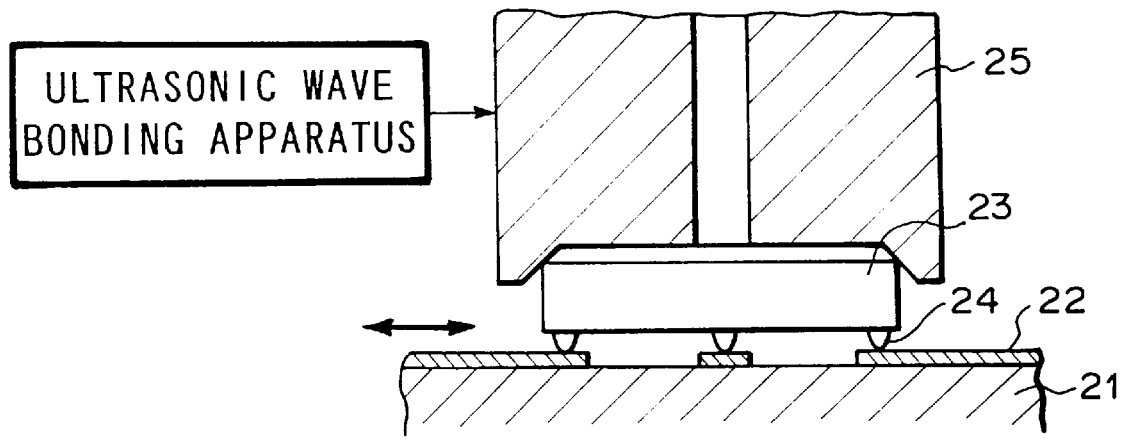
FIG. 3 is a cross-sectional view showing the operation of a conventional ultrasonic wave bonding technique.
Figure 4A:
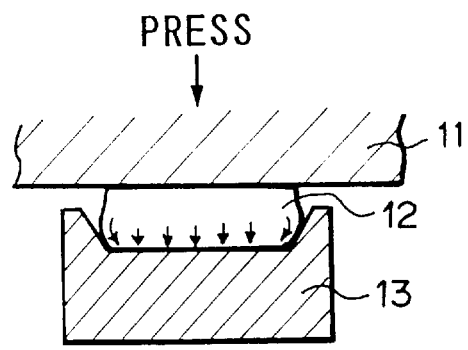
FIG. 4A is a cross-sectional view showing a bonding process of a lead and a bump in the prior art.
Figure 4B:
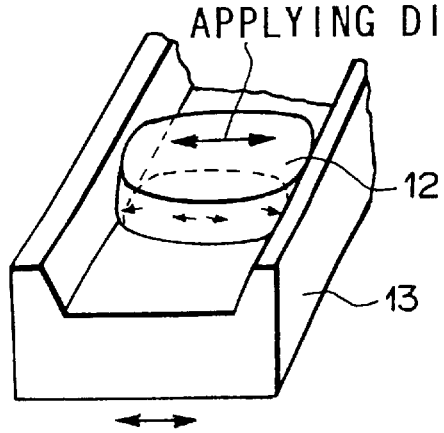
FIG. 4B is a perspective view of FIG. 4A.

As compared with a flat bottom surface of the recess portion 14 of the conventional structure shown in FIGS. 4A and 4B, the groove 4 of this embodiment has a broader area by the amount corresponding to the inclination of the slant surfaces of the V-shaped groove 4. Therefore the area in which the bump and the lead of this embodiment is bonded is equal to about 1.05 time as large as that of the conventional structure. Accordingly, the bonding strength of the lead and the bump can be made stronger.

It should be noted, however, that the groove may comprise a first and second slant surfaces and a bottom surface positioned therebetween in the present invention.

As described above, according to the present invention, when the semiconductor chip having the bumps is face-down bonded to the lead frame having many leads projecting in multi-directions by the ultrasonic wave, the bonding strength and the bonding position can be kept uniform for all the bumps because the grooves extending in one direction are provided to the tips of the leads, whereby the reliability of the bonding can be enhanced.

Further, according to the present invention, it is unnecessary to take into consideration the individual bonding condition between the bump of the semiconductor chip and the lead, and the bumps and the leads can be collectively bonded to each other by the face-down bonding based on ultrasonic wave, so that the productivity can be enhanced.

What is claimed is:

1. A lead frame for face-down bonding, comprising:
   plural leads which are bonded to bumps formed on electrodes of a semiconductor chip by face-down bonding based on ultrasonic wave; and
   grooves formed on the leads at positions at which the leads are bonded to the bumps,
   wherein the leads comprise a first lead extending in a first direction and a second lead extending in a second direction which is different from the first direction, and all the grooves extend in the same direction.

2. The lead frame for face-down bonding as claimed in claim 1, wherein the direction of the grooves is the first direction.

3. The lead frame for face-down bonding as claimed in claim 1, wherein the first direction is a width direction of the lead frame.

4. The lead frame for face-down bonding as claimed in claim 3, wherein the second direction is a length direction of the lead frame.

5. The lead frame for face-down bonding as claimed in claim 4, wherein the direction of the grooves is the first direction.

6. The lead frame for face-down bonding as claimed in claim 4, wherein the direction of the grooves is the second direction.

7. The lead frame for face-down bonding as claimed in claim 1, wherein the direction of the grooves is coincident with an ultrasonic wave applying direction on the face-down bonding.

8. The lead frame for face-down bonding as claimed in claim 1, wherein the leads are subjected to metal plating at least at a groove portion thereof.

9. A lead frame for face-down bonding, comprising:

plural divergently aligned leads which are bonded to bumps formed on electrodes of a semiconductor chip by face-down bonding based on ultrasonic wave; and plural grooves that are all parallel to each other and having V-shaped cross sections, the parallel grooves being in respective ones of the divergently aligned leads at positions at which the leads are bonded to the bumps.

10. The lead frame for face-down bonding as claimed in claim 9, wherein the direction of the grooves is coincident with an ultrasonic wave applying direction on the face-down bonding.

11. The lead frame for face-down bonding as claimed in claim 9, wherein the leads are subjected to metal plating at least at a groove portion thereof.

12. A lead frame for face-down bonding, comprising:

plural leads which are bonded to bumps formed on electrodes of a semiconductor chip by face-down bonding based on ultrasonic wave; and grooves having V-shaped cross section formed on the leads at positions at which the leads are bonded to the bumps, wherein the leads comprise a first lead extending in a first direction and a second lead extending in a second direction which is different from the first direction, and all the grooves extend in the same direction.

13. The lead frame for face-down bonding as claimed in claim 12, wherein the direction of the grooves is the first direction.

14. The lead frame for face-down bonding as claimed in claim 12, wherein the first direction is a width direction of the lead frame.

15. The lead frame for face-down bonding as claimed in claim 14, wherein the second direction is a length direction of the lead frame.

16. The lead frame for face-down bonding as claimed in claim 15, wherein the direction of the grooves is the first direction.

17. The lead frame for face-down bonding as claimed in claim 15, wherein the direction of the grooves is the second direction.

18. The lead frame for face-down bonding as claimed in claim 12, wherein the direction of the grooves is coincident with an ultrasonic wave applying direction on the face-down bonding.

19. The lead frame for face-down bonding as claimed in claim 12, wherein the leads are subjected to metal plating at least at a groove portion thereof.

* * * * *